United States Patent
Traber et al.

(10) Patent No.: US 6,851,080 B1
(45) Date of Patent: Feb. 1, 2005

(54) AUTOMATIC ACTIVATION OF ASIC TEST MODE

(75) Inventors: Richard L. Traber, Fremont, CA (US); Li-Jau Yang, San Jose, CA (US)

(73) Assignee: 3Com Corporation, Santa Clara, CA (US)

(*) Notice: Subject to any disclaimer, the term of this patent is extended or adjusted under 35 U.S.C. 154(b) by 0 days.

(21) Appl. No.: 09/368,918

(22) Filed: Aug. 5, 1999

Related U.S. Application Data

(60) Provisional application No. 60/118,711, filed on Feb. 5, 1999.

(51) Int. Cl.[7] .......................... G01R 31/28; H03K 19/00
(52) U.S. Cl. .......................................... 714/726; 326/16
(58) Field of Search ................................. 714/726, 718, 714/729, 724; 365/200, 201; 326/16

(56) References Cited

U.S. PATENT DOCUMENTS

| | | | | |
|---|---|---|---|---|
| 4,491,935 A | * | 1/1985 | Ozawa et al. ................ 345/559 |
| 5,130,645 A | * | 7/1992 | Levy ........................ 324/158.1 |
| 5,167,020 A | * | 11/1992 | Kahn et al. .................. 711/119 |
| 5,180,937 A | * | 1/1993 | Laird et al. .................. 327/276 |
| 5,299,203 A | * | 3/1994 | Steele ........................ 714/724 |
| 5,347,520 A | * | 9/1994 | Simpson et al. ............. 714/727 |
| 5,357,572 A | * | 10/1994 | Bianco et al. ................. 380/2 |
| 5,461,332 A | * | 10/1995 | Mirov et al. .................. 327/41 |
| 5,479,127 A | * | 12/1995 | Bui ............................ 327/142 |
| 5,596,537 A | * | 1/1997 | Sukegawa et al. .......... 365/201 |
| 5,726,999 A | * | 3/1998 | Bradford et al. ............. 714/727 |
| 5,768,289 A | * | 6/1998 | James ........................ 714/727 |
| 5,774,474 A | * | 6/1998 | Narayanan et al. ......... 714/726 |
| 5,831,993 A | * | 11/1998 | Graef ........................ 714/727 |
| 5,881,218 A | * | 3/1999 | Sanghani et al. ............. 714/30 |
| 5,889,788 A | * | 3/1999 | Pressly et al. .............. 714/726 |
| 5,951,703 A | * | 9/1999 | Sprouse et al. ............. 714/730 |
| 6,023,778 A | * | 2/2000 | Li .............................. 714/726 |
| 6,114,892 A | * | 9/2000 | Jin ............................ 327/202 |
| 6,418,545 B1 | * | 7/2002 | Adusumilli ................ 714/729 |
| 6,427,222 B1 | * | 7/2002 | Shau ............................ 716/4 |

* cited by examiner

Primary Examiner—Joseph D. Torres

(57) ABSTRACT

An automatic scan test enable signal assertion system and method responds to transitions in signals communicated via selected pins that are not dedicated solely to testing operations. Pins are utilized to communicate a trigger signal and a stage progression signal. The trigger signal provides an indication to initiate a scan test enable signal assertion or deassertion and the stage progression signal controls the progress of the scan test enable activation or deactivation initiation. A scan test enable trigger sensing component provides an assertion or deassertion notification when logical values of a trigger signal captured during multiple stages provide an indication to begin a scan test enable signal assertion or deassertion. A staging component advances the logical values through stages in accordance with a progression signal and issues an asserted or deasserted scan test enable signal based upon the assertion or deassertion notification from the scan test enable trigger sensing component.

7 Claims, 6 Drawing Sheets

200

```
/ ******************************* 
* *         BScanEnBlk Module              * *
**_____          * *
******************************* /
/ /------------------------------------------------
module BScanEnBlk (BScanEnbN,           // Output
                pciClk, ioRstN );   //Input
/ /------------------------------------------------
output BScanEnbN ;
input   pciClk, ioRstN ;
reg    Q1_ioRstN, Q2_ioRstN, BScanEnbN ;
/ /----------------------------Circuit ----------------------
/ / Generating the BScanEnbN ;
always  @ (posedge pciClk )
        begin
           Q1_ioRstN  <- ioRstN;
        end
always @ (posedge pciClk)
        begin
           Q2_ioRstN <- Q1_iorstN ;
        end
wire      D_BScanEnbN       --(- Q1_ioRstN & Q2_ioRstN ) ;
always @ (posedge pciClk )
        begin
           BScanEnbN <- D_BScanEnbN;
        end
endmodule
```

FIG. 2

AUTOMATIC ACTIVATION OF ASIC TEST MODE

RELATED APPLICATIONS

This application claims the benefit of U.S. Patent Provisional Application Ser. No. 60/118,711 filed Feb. 5, 1999, entitled "Automatic Activation of ASIC Test Mode" which is hereby incorporated by this reference.

FIELD OF THE INVENTION

The present invention relates to the field of electrical circuit testing. More particularly, the present invention relates to a system and method to automatically activate a test enable signal within an application specific integrated circuit (ASIC) on a printed circuit board.

BACKGROUND OF THE INVENTION

Electronic systems and circuits have made a significant contribution towards the advancement of modem society and are utilized in a number of applications to achieve advantageous results. Numerous electronic technologies such as digital computers, calculators, audio devices, video equipment, and telephone systems facilitate increased productivity and cost reduction in analyzing and communicating data, ideas and trends in most areas of business, science, education and entertainment. Frequently, electronic systems designed to provide these results comprise a variety of components including application specific integrate circuits (ASIC) arranged on printed circuit boards. Efficient testing of ASIC chips and printed circuit boards is an important part of assuring electrical connections between ASICs and printed circuit boards do not result in inappropriate electrical shorts or open circuit conditions.

Historically, in-circuit tests were relied on to test electrical circuits. Traditional in-circuit testing techniques include test operation dedicated pogo pins that contact testing pads on the bottom side of a printed circuit board. A tester utilizes the pogo pins to probe the testing pads by activating certain portions of the printed circuit board and observing the results. Pogo pin techniques are relatively expensive and unreliable. For example, pogo pin pads usually take up valuable circuit board resources and it is often difficult to get pads to accurately line up with pogo pins in the tester. Complex ASICs and circuit boards typically require numerous pogo pins and testing pads, resulting in testing pad density problems such as difficulty in finding room for enough probe points.

As the complexity of ASICs advance, designers rely more on built in self test (BIST) diagnostics capability for effective circuit testing. Modem BIST techniques typically include the insertion of a scan test system in an ASIC. Typically, scan test systems rely on the application of test vectors to initiate scan test operations and to stimulate certain aspects of the ASIC or printed circuit board. A scan test system usually includes a scan test enable signal that is part of a scan test initiation operation. Some scan test systems rely on communication of a special test vector to activate the scan test enable signal and other systems rely on a dedicated scan test enable pin to provide a dedicated scan test enable signal. While BIST techniques usually require less resources than pogo pin in-circuit testing, generating special test vectors and/or providing dedicated scan test pins for scan testing operations expends valuable resources.

Creating sequences of signals to utilize as test vectors that a device (e.g., an ASIC) decodes to activate a scan test enable signal is problematic. Usually, a scan test enable signal is utilized to put the ASIC or circuit board in scan test mode and it is detrimental to the functionality of a chip to go into test mode during normal operations. Typically, a test vector utilized to initiate scan test enable signal is required to be a very unique sequence of signals to avoid the test vector occurring during normal operations in a system and accidentally activating scan test mode. Thus, significant resources are often expended determining an otherwise "illegal" sequence of signals that has an extremely low probability of occurring. Additional resources are expended designing an algorithm that recognizes when the special sequence of illegal signals does occur and interpreting the special illegal sequence as a command to activate a scan test enable signal. Optimal results are achieved if the "illegal" sequence of signals only happens when entering a test mode is desired. However, even after expending significant resources designers can not typically guarantee the special "illegal" sequence will not occur accidentally and put an ASIC in test mode at an inappropriate time.

Some BIST techniques attempt to avoid the difficulties of special sequence test vectors by including a pin dedicated to the communication of a scan test enable signal. However, this approach also uses up valuable resources. Usually, there is a limited number of pins on an ASIC or printed circuit board and tying up one or more of those pins for dedicated communication of a scan test enable signal results in fewer pins being available for other testing functions and normal functional operations.

What is required is a system and method that activates a scan test enable signal without the requirement of complex special signal sequences transmitted via a pin dedicated solely to scan test enable signal communication. The system and method should permit a designer to efficiently and effectively assert a scan test enable signal. The electronic system and method should minimize adverse redesign impacts to existing ASIC and circuit board designs and facilitate utilization of existing scan test architectures.

SUMMARY OF THE INVENTION

The present invention is a system and method that activates a scan test enable signal without the requirement of complex special signal sequences or a dedicated pin to communicate a scan test enable signal. The system and method of the present invention permits a designer to efficiently and effectively assert a scan test enable signal by controlling existing signals being communicated to the system. Thus, redesign impacts to existing ASIC and circuit board designs are minimized. The system and method of the present invention provides a scan test enable signal compatible with a variety of scan test architectures.

In one embodiment of the present invention an automatic scan test enable signal assertion system is utilized to provide a scan test enable signal. The automatic scan test enable signal assertion system is implemented in a peripheral component interconnect (PCI) compatible system and responds to appropriate transitions in a PCI reset signal and a PCI clock signal that are controlled by a tester during testing operations. Activation and deactivation of a scan test enable signal is automatically triggered by the appropriate transitions in the PCI reset signal and PCI clock signal. In one example, a scan test enable signal is activated by setting the PCI reset signal high and applying a low to high transition of the PCI clock signal, then the PCI reset signal is set low for the next two low to high transitions of the PCI clock. After the scan test enable signal is activated the system is operating in scan test mode. To maintain scan test operations, transitions in the PCI clock are suspended. The scan test enable signal remains activated and the system continues in scan test mode unless the PCI clock signal is started again. If the PCI clock is not suspended and is permitted to run, which is the case in a normally functioning system, the scan test enable signal is automatically deasserted.

BRIEF DESCRIPTION OF THE DRAWINGS

FIG. 2 is a partial listing of a hardware description file that describes one embodiment of an automatic scan test enable signal assertion system of the present invention.

DETAILED DESCRIPTION OF THE INVENTION

Reference will now be made in detail to the preferred embodiments of the invention, a method and system to automatically activate a scan test enable signal, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

The present invention is a system and method that automatically asserts a scan test enable signal as part of a scan testing procedure. An automatic scan test enable signal assertion system and method of the present invention responds to transitions in signals communicated via selected pins. The selected pins are not dedicated solely to testing operations. A selected pin is utilized during normal operations to communicate functional signals (e.g., a PCI reset signal, PCI clock signal, etc.). During testing operations a selected pin is utilized to communicate a signal involved in the assertion and deassertion of a scan test enable signal. In one embodiment of the present invention a first selected pin is utilized to communicate a trigger signal (e.g., a PCI reset signal) and a second pin is utilized to communicate a stage progression signal (e.g., a PCI clock signal). In one embodiment of the present invention, the trigger signal and stage progression signal are controlled by a tester during testing procedures. The trigger signal provides an indication to initiate a scan test enable signal assertion or deassertion and the stage progression signal controls the progress of the scan test enable activation or deactivation initiation. When appropriate predetermined transitions occur in the trigger signal and the logical values of those transitions are permitted to proceed through the stages of the present invention a scan test enable signal is automatically activated.

Figure 1A:
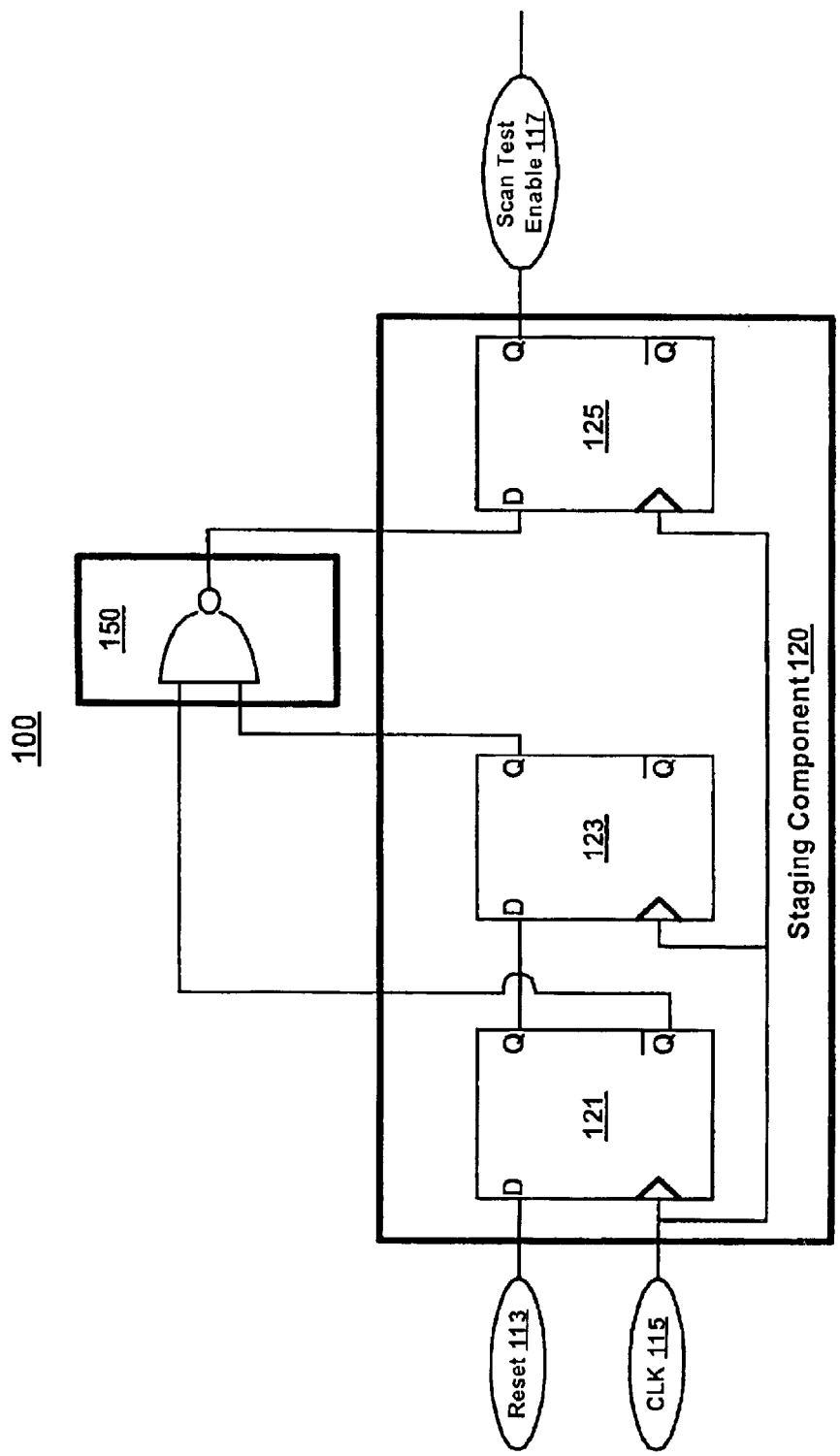
FIG. 1A is a block diagram of an automatic scan test enable signal assertion system, one embodiment of present invention.

FIG. 1A is a block diagram of automatic scan test enable signal assertion system 100, one embodiment of present invention. Automatic scan test enable signal assertion system 100 comprises a staging component 120 and a scan test enable trigger sensing component 150. Staging component 120 includes first stage scan enabling component 121, second stage scan enabling component 123, and third stage scan enabling component 125. Scan test enable trigger sensing component 150 is coupled to first stage scan enabling component 121, second stage scan enabling component 123, and third stage scan enabling component 125. First stage scan enabling component 121 is coupled to second stage scan enabling component 123. First stage scan enabling component 121 is also coupled to a trigger signal (e.g., PCI reset signal 113) and third stage scan enabling component 125 is coupled to scan test enable signal 117. First stage scan enabling component 121, second stage scan enabling component 123, and third stage scan enabling component 125 are coupled to a stage progression signal (e.g., PCI clock 115).

The components of scan test enable signal assertion system 100 cooperatively function to provide an automatic activation and deactivation of scan test enable signal 117. Scan test enable trigger sensing component 150 is adapted to provide an assertion or deassertion notification when logical values of a trigger signal captured during multiple stages provide an indication to begin a scan test enable signal assertion or deassertion. Staging component 120 is adapted to advance the logical values of the trigger signal through a plurality of stages in accordance with a progression signal and issue an asserted or deasserted scan test enable signal based upon the assertion or deassertion notification from scan test enable trigger sensing component 150. First stage scan enabling component 121, second stage scan enabling component 123, and third stage scan enabling component 125 are registers (e.g., D flip flops) in one embodiment of scan test enable signal assertion system 100. First stage scan enabling component 121 and second stage scan enabling component 123 are adapted to track logical values of the trigger signal (e.g., PCI reset signal 113) during a first stage and a second stage respectively. Third stage scan enabling component 125 is adapted to maintain an active scan enable signal status until the stage progression signal (e.g., PCI clock signal 115) permits a contrary indication to be received by third stage scan enabling component 125.

Figure 1B:
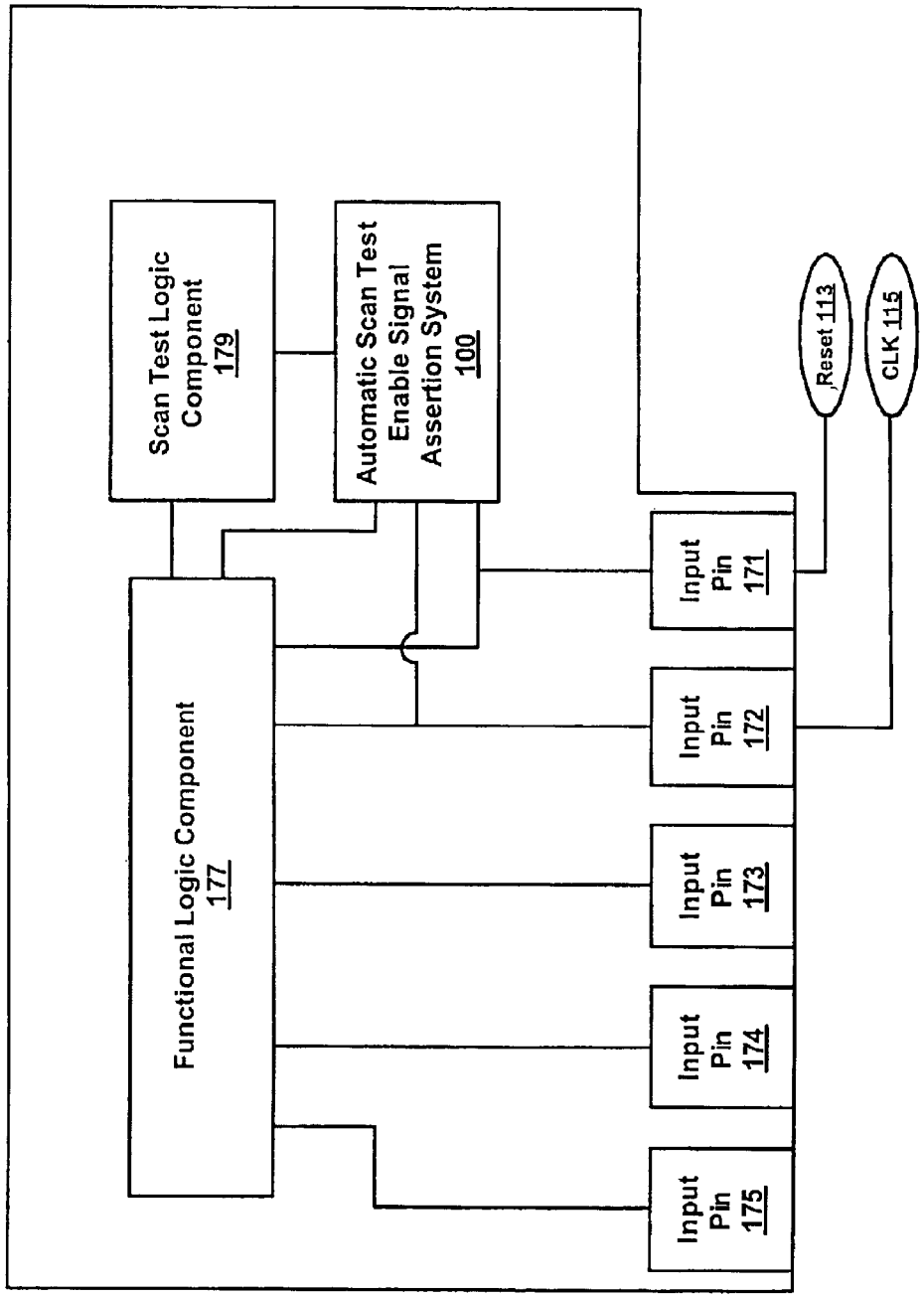
FIG. 1B is an illustration of an automatic scan test enable signal assertion printed circuit board implementation of one embodiment of the present invention.

In one embodiment of the present invention, scan test enable signal assertion system 100 automatically activates or deactivates a scan test enable signal based upon indications from a trigger signal and stage progression signal. The trigger signal and stage progression signals are communicated via pins that are utilized to transmit functional signals during normal operations. FIG. 1B is an illustration of automatic scan test enable signal assertion printed circuit board 170, one embodiment of the present invention. Automatic scan test enable signal assertion comprises functional logic component 177, scan test logic component 179, scan test enable signal assertion system 100, and input pins 171, through input pin 175. Functional logic component 177 is coupled to scan test logic component 179, scan test enable signal assertion system 100, and input pins 171 through input pin 175. Scan test enable signal assertion system 100 is coupled to functional logic component 177, scan test enable signal assertion system 100, input pin 171 and input pin 172.

The components of automatic scan test enable signal assertion printed circuit board 170 cooperatively operate to perform normal and test operations including automatic assertion and deassertion of a scan test enable signal. Functional logic component 177 is adapted to perform normal functions during normal operations. Scan test logic component 179 is adapted to perform scan test functions during scan test operations. In one embodiment of the present invention, functional logic component 177, scan test logic component 179, and scan test enable signal assertion system 100 are integrated on one ASIC. Input pins 171 through 175 are adapted to provide communication of normal signals during normal operations. Input pin 171 and input pin 172 are adapted to communicate a trigger signal and a stage progression signal during scan test operations.

In one embodiment of the present invention, scan test enable signal assertion printed board 170 is a network interface card (NIC) implemented in a PCI compliant system. Input pin 171 and input pin 172 communicate a PCI reset signal and a PCI clock signal during normal operations. During testing operations input pin 171 and input pin 172 communicate a trigger signal and stage progression signal respectively. In one embodiment the PCI compliant signals are specially controlled to act as a trigger signal and a stage progression signal during testing operations. For example, PCI reset signal 113 functions as a trigger signal and PCI clock signal 115 functions as an stage progression signal. In one example of scan test enable signal assertion printed circuit board 170, PCI reset signal 113 and PCI clock signal 115 are controlled by a tester during testing operations to act as a trigger signal and a stage progression signal. In one embodiment, scan test enable signal assertion printed circuit board 170 remains in a system (e.g., a computer) during testing and a tester enables and disables transmission of a PCI clock or PCI reset signal to scan test enable signal assertion printed circuit board 170. In another example of scan test enable signal assertion printed circuit board 170, scan test enable signal assertion printed circuit board 170 is removed from a system (e.g., a computer) and plugged into a tester that generates a trigger signal and a stage progression signal in addition to other test signals.

Referring again to FIG. 1A, in one embodiment of scan test enable signal assertion system 100 a scan test enable signal is automatically asserted or deasserted in response to predetermined logical value transitions in PCI reset signal 113 and PCI clock signal 115. PCI reset signal 113 is activated by transitioning to a high logical value. Scan test enable trigger sensing component 150 is adapted to respond to logical values from different stages in PCI reset signal 113 forwarded by first stage scan enabling component 121 and second stage scan enabling component 123. Progression from one stage to another stage occurs at low to high transitions in PCI clock signal 115. First stage scan enabling component 121 is adapted to capture the logical value of PCI reset signal 113 at the rising edge (e.g., low to high transition) of a PCI clock signal 115. First stage scan enabling component 121 stores the captured logical value and provides the inverse of the captured logical value to scan test enable trigger sensing component 150. Second stage scan enabling component 121 is adapted to capture a logical value from first stage component 121 at the rising edge of the PCI clock signal 115 and store it during a second stage. Scan test enable trigger sensing component 150 issues a notification to third stage scan enabling component 125 to assert or deassert a scan test enable signal. Third stage scan enabling component 125 delays asserting or deasserting scan test enable signal 117 until there is a low to high transition in PCI clock signal 315 initiating a stage progression and "permitting" a change in the scan test enable signal status.

In one implementation of scan test enable signal assertion system 100, scan test enable trigger sensing component 150 includes a NAND Boolean logic component. Scan test enable trigger sensing component 150 issues a notification to third stage scan enabling component 125 to assert a scan test enable signal if the inverse logical value forwarded from first stage scan enabling component 121 and the logical value from second stage scan enabling component 123 are logical one values ("high"). If the logical values forwarded to scan test enable trigger sensing component 150 from first stage scan enabling component 121 and second stage scan enabling component 123 are not logical one values, scan test enable trigger sensing component 150 issues an indication to third stage scan enabling component 127 to deassert scan test enable signal 117.

Figure 3:
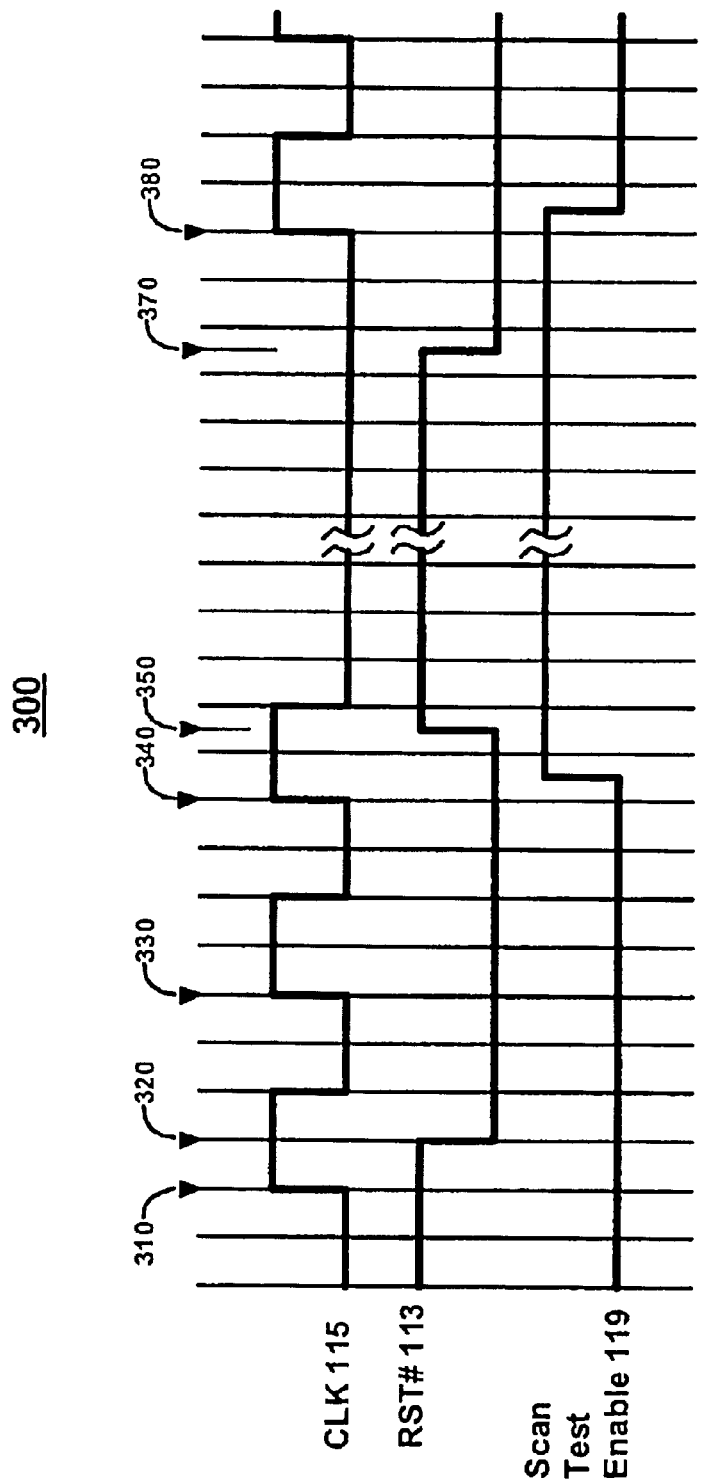
FIG. 3 is an illustration of one example of an automatic scan test enable signal assertion system timing diagram associated with an automatic scan test enable signal assertion system of the present invention.

FIG. 3 is an illustration of automatic scan test enable signal assertion system timing diagram 300, one example of a timing diagram associated with an automatic scan test enable signal assertion system of the present invention. Timing diagram 300 illustrates transitions in PCI clock signal 115 and PCI reset signal 113 that result in a scan test enable signal assertion system of the present invention entering a scan test mode. At some time prior to time 310 reset signal 113 is set to a logical high value. At time 310 PCI clock signal 115 transitions from a logical low value to a logical high value. PCI reset signal 113 transitions from a logical high value to a logical low value at time 320 and is kept low for two consecutive logical low value to logical high value transitions in PCI clock 115, for example the transition at time 330 and the transition at time 340. The scan test enable signal assertion system activates a scan test enable signal 119 after the low to high transition of PCI clock signal 115 at time 340. After time 340 reset signal 113 is permitted to transition from high to low and vice versa in accordance with testing protocols (e.g., at times 350 and 370) requiring testing of features associated with the reset function. The scan test enable signal assertion system deactivates scan test enable signal 119 when the transition from low to high occurs again in PCI clock signal 115 (e.g., at time 380) after the high to low transition in PCI clock signal 115 at time 340.

FIG. 2 is a partial listing of a hardware description file 200 that describes one embodiment of the present invention. The circuit described by hardware description file 200 generates scan test enable signal BscanEnbN based upon transitions in PCI clock signal pciClk and PCI reset signal ioRstN. BscanEnbN, pciClk and ioRstN are similar to scan test enable signal 117, PCI clock signal 115 and PCI reset signal 113 respectively. In one embodiment of the present invention, Q1-ioRstN and Q2-ioRstN represent registers. On a positive going edge of the pciCLK signal, Q1-ioRstN is set to the logical value of ioRstN and Q1-ioRstN "tracks" the logical value of ioRstN during a first stage. On a positive going edge of pciCLK signal Q2-ioRstN is set to the logical value of Q1-ioRstN during a prior cycle in the pciClk signal and Q2-ioRstN "tracks" the logical value of ioRstN during a second stage. A scan enable indication signal D_BscanEnbN is determined by a Boolean logic analysis of the logic values in Q1-ioRstN and Q2-ioRstN. In one example of hardware description file 200 the Boolean logic analysis is a NAND logic analysis. BscanEnbN is set to the same logical value as D_BscanEnbN at the subsequent positive going edge of the pciclk signal.

Figure 4:
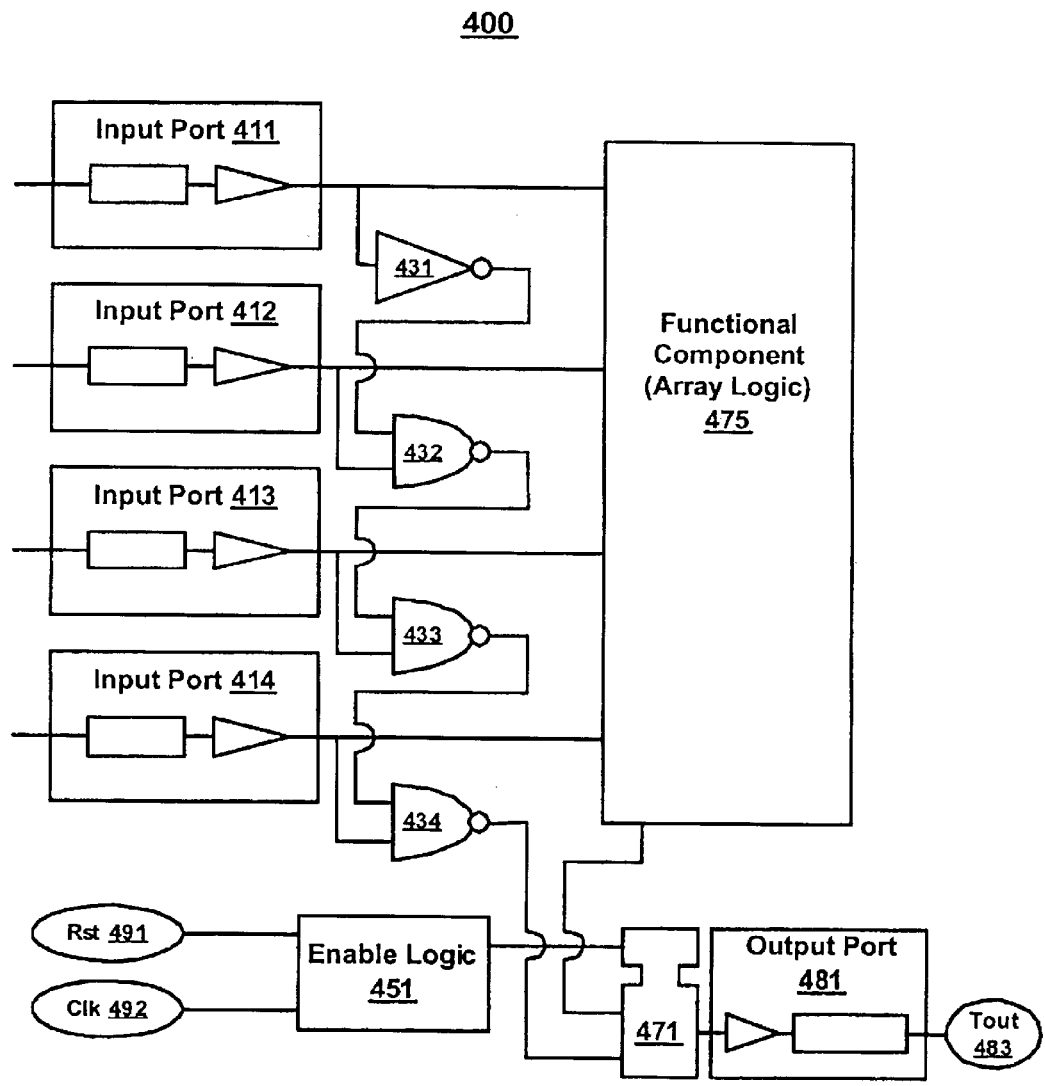
FIG. 4 is a block diagram of automatic scan test enable signal activation system, one embodiment of the present invention adapted to perform short circuit and open circuit testing.

FIG. 4 is a block diagram of automatic scan test enable signal activation system 400, one embodiment of the present invention. Automatic scan test enable signal activation system 400 comprises input ports 411 through 414, inverter 431, NAND gates 432 through 434, functional component 475, mutliplexer (MUX) 471, test data output port 481, and automatic scan test enable signal assertion system 451. Input ports 411 through 414 are coupled to functional component 475. Input port 411 is coupled to inverter 431 and input ports 411 through 414 are coupled to NAND components 432 through 434 respectively. Mutliplexer (MUX) 471 is coupled to functional component 475, NAND component 434, automatic scan test enable signal assertion system 451 and test data output port 481. Inverter 431 is coupled to NAND component 432 which is coupled to NAND component 433 which in turn is coupled to NAND component 434 to form a NAND tree scan test chain.

The components of scan test enable signal activation system 400 cooperatively function to test input connections of an ASIC or printed circuit board. Input ports 411 through 414 are adapted to function as input connections that communicate signals to an ASIC or printed circuit board. Inverter 431 and NAND gates 432 through 434 are adapted to serially capture information from the respective input connections that are coupled to inverter 431 and NAND gates 432 through 434. Functional component 475 is adapted to perform normal operation of the ASIC or printed circuit board. Mutliplexer (MUX) 471 is adapted to permit transmission of signals from the NAND tree test chain or functional component 475 depending upon the assertion of a scan test enable signal. Test data output port 481 is adapted to communicate test data off of an ASIC or printed circuit board. Automatic scan test enable signal assertion system 451 is adapted to automatically assert or deassert the scan test enable signal in response to transitions in a trigger signal and stage progression signal similar to automatic scan test enable signal assertion system 100.

In one embodiment of the present invention, the inputs to an ASIC or printed circuit board are tied to the NAND tree scan test chain of automatic enable scan test system 400. Testing is automatically initiated by automatic scan test enable signal assertion system 451 which asserts or deasserts a scan test enable signal based upon transitions in reset signal 491 and clock 492. The NAND tree scan test chain of automatic enable scan test system 400 is utilized during an input of a parametric test to test whether the inputs of an ASIC or printed circuit board have inappropriate open circuits, short circuits or threshold levels. In one example, a test vector sets non inverting inputs such as input ports 411 through 414 low and then one by one serially toggles them high and low. In one example of a PCI compatible implementation of scan test enable signal activation system 400, inputs are serially toggled as follows:

AD[0] (start of the chain), AD[1], AD[2], AD[3], AD[4], AD[5],

AD[6], AD[7], CBE[0], AD[8], AD[9], AD[10], AD[11], AD[12],

AD[13], AD[14], AD[15], CBE[1], PAR, SERR#, PERR#, STOP#,

DEVSEL#, TRDY#, IRDY#, FRAME#, CBE[2], AD[16], AD[17],

AD[18], AD[19], AD[20], AD[21], AD[22], AD[23], IDSEL, CBE[3],

AD[24], AD[25], AD[26], AD[27], AD[28], AD[29], AD[30], AD[31],

PME#, REQ#, GNT#, RST#, INTA# (end of the chain),

TDO/TDI (monitoring point for the chain).

The results of the toggling are captured by the NAND tree scan test chain and captured information associated with an input connection is communicated off of the ASIC or printed circuit board in the form of test data output signal 483 via the test data output port 481.

Figure 5:
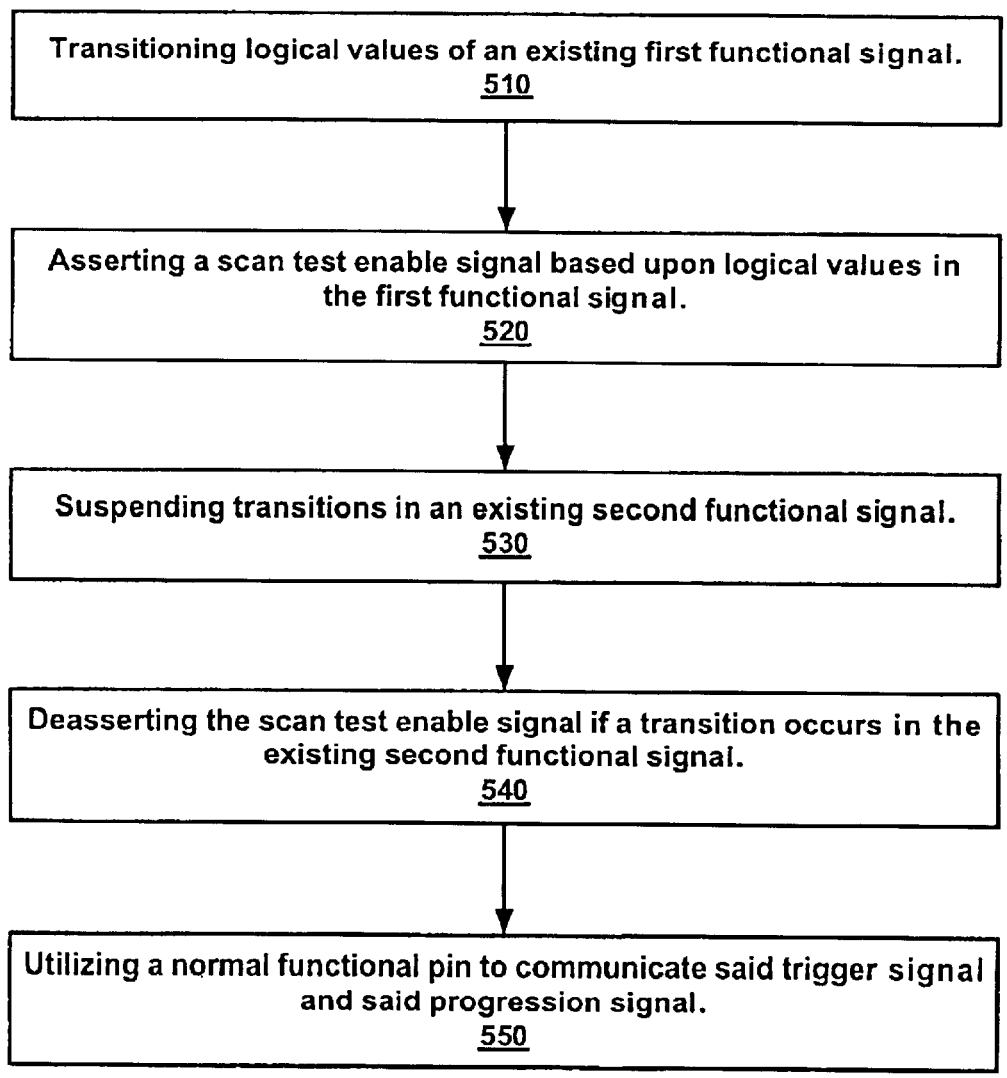
FIG. 5 is a flow chart illustrating steps in automatic scan test enable signal assertion method, one embodiment of the present invention.

FIG. 5 is a flow chart illustrating steps in automatic scan test enable signal assertion method 500. Automatic scan test enable signal assertion method 500 automatically asserts and deasserts a scan test enable signal based upon transitions in a trigger signal (e.g., a PCI reset signal) and a stage progression signal (e.g., a PCI clock signal). In one embodiment of automatic scan test enable signal assertion method 500 signals communicated via normal functional signal pins serve as the trigger signal and stage progression signal. When appropriate transitions occur in the trigger signal and the stage progression signal automatic scan test enable signal assertion method 500 asserts or deasserts a scan test enable signal. Automatic scan test enable signal assertion method 500 does not rely upon complex test vector sequences or pins dedicated to the communication of a scan test enable signal.

Scan test system enabling method 500 transitions logical values of a trigger signal in Step 510. In one embodiment of the present invention, the trigger signal is a PCI reset signal. In one implementation of scan test system enabling method 500, a tester transitions a PCI reset signal from a low logical value to high logical value and holds it at the high logical value until a high to low transition in a PCI clock signal. The tester then transitions the PCI reset signal to a low logical value and holds it there for two consecutive low logical value to high logical value transitions of the PCI clock signal. In one example of the present invention the logical values of the trigger signal are transmitted through stages determined by a stage progression signal.

In one embodiment of the present invention, automatic scan test enable signal assertion method 500 processes information in stages. Automatic scan test enable signal assertion method 500 waits for indications from a stage progression signal before processing information in a following stage. For example, automatic scan test enable signal assertion method 500 processes a logical value of the trigger signal through stages in accordance with transitions in the stage progression signal (e.g., a PCI clock signal). A high to low transition of a stage progression signal (e.g., a PCI clock signal) permits information to be processed in a following stage.

In step 520 automatic scan test enable signal assertion method 500 asserts a scan test enable signal based upon logical values in the trigger signal (e.g., a PCI reset signal). In one embodiment of the present invention, automatic scan test enable signal assertion method 500 asserts a scan test enable signal based upon logical values in said trigger signal captured at different stages (e.g., a first stage. and a second stage). In one embodiment of the present invention a first stage and second stage comprise registers (e.g., D flip flops). Then automatic scan test enable signal assertion method 500 a initiates a said scan test enable indication signal based upon said captured logical values. For example, if a trigger signal (e.g., a PCI reset signal) is at logical 1 value during a first stage and at a logical 0 value during a second stage, automatic scan test enable signal assertion method 500 a initiates a said scan test enable indication signal. In one embodiment of scan test system enabling method 500 a scan test enable trigger sensing component provides an assertion or deassertion notification when logical values of a trigger signal captured during multiple stages provided an indication to assert or deassert a scan test enable signal. If the logical value of the trigger signal is at a logical 0 value during a third stage a scan test enable signal is forwarded in response to a stage progression signal.

Transitions in a stage progression signal are suspended in step 530. In one embodiment of the present invention the stage progression signal is a PCI clock signal. In one example of automatic scan test enable signal assertion method 500, the stage progress signal is controlled by a tester during testing operations and a pin on a printed circuit board that is normally coupled to a PCI clock signal operates to communicate the stage progression signal produced by a tester during test operations. The tester controls transitions of the stage progression signal from a logical low value to a logical high value and vise versa. After initial transitions in the stage progression signal the tester suspends transitions in the stage progression signal.

Scan test enable signal is deasserted in Step 540 if a transition occurs in the stage progression signal. In one embodiment of the present invention the stage progression signal is a PCI clock signal. If a scan test enable signal is asserted and the PCI clock signal transitions the scan test enable signal is deasserted.

In Step 550 normal functional pins are utilized to communicate the trigger signal and stage progression signals. In one embodiment of the present invention, automatic scan test enable signal assertion method 500 communicates a trigger signal via a pin utilized to communicate a PCI reset signal during normal operations. In one embodiment of the present invention, automatic scan test enable signal assertion method 500 communicates a stage progression signal via a pin utilized to communicate a PCI clock signal during normal operations.

Thus, the present invention activates a scan test enable signal without the requirement of complex special signal sequences or a dedicated pin to communicate a scan test enable signal. The system and method of the present invention permits a designer to efficiently and effectively assert a scan test enable signal by controlling existing signals (e.g., a PCI clock signal and PCI reset signal) being communicated to the system. Thus, redesign impacts to existing ASIC and circuit board designs are minimized. The system and method of the present invention provides a scan test enable signal compatible with a variety of scan test architectures.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An automatic scan test enable signal assertion method comprising the steps of:
    a) transitioning logical values of a trigger signal;
    b) asserting a scan test enable signal based upon logical values in said trigger signal;
    c) suspending transitions in a stage progression signal;
    d) deasserting said scan test enable signal if a transition occurs in said stage progression signal; and
    e) utilizing a normal functional pin to communicate said trigger signal.

2. The automatic scan test enable signal assertion method of claim 1 further comprising the step of waiting for indications from a stage progression signal before processing information in a following stage.

3. The automatic scan test enable signal assertion method of claim 1 further comprising the step of transmitting a logical value of said trigger signal through stages determined by said stage progression signal.

4. The automatic scan test enable signal assertion method of claim 3 in which said scan test enable signal is asserted based upon a logical value of said trigger signal in a first stage and a logical value of said trigger signal in a second stage.

5. The automatic scan test enable signal assertion method of claim 3 in which said scan test enable signal is asserted if said trigger signal is at logical 1 value during a first stage and the trigger signal is at a logical 0 value during a second stage and third stage.

6. The automatic scan test enable signal assertion method of claim 1 in which said trigger signal is a reset signal and said stage progression signal is a clock signal.

7. The automatic scan test enable signal assertion method of claim 1 further comprising the steps of:
    capturing logical values of said trigger signal in a first stage and a second stage;
    initiating a scan test enable indication signal based upon captured logical values; and
    forwarding a said scan test enable signal in response to a said stage progression signal.

* * * * *